US005937072A

United States Patent [19]

Combest

[11] Patent Number: 5,937,072

[45] **Date of Patent: *Aug. 10, 1999**

[54] AUDIO CROSSOVER CIRCUIT

[75] Inventor: Christopher E. Combest, Leawood, Kans.

[73] Assignee: Multi Service Corporation, Kansas City, Mo.

[ * ] Notice: This patent is subject to a terminal disclaimer.

[21] Appl. No.: 08/811,120

[22] Filed: Mar. 3, 1997

[51] Int. Cl.[6] .......... H03G 5/00

[52] U.S. Cl. .......... 381/99; 381/98

[58] Field of Search .......... 381/98, 99, 100

[56] References Cited

U.S. PATENT DOCUMENTS

| | | | |
|---|---|---|---|
| 1,931,235 | 4/1933 | Nicolson . | |
| 2,612,558 | 9/1952 | Klipsch . | |
| 2,802,054 | 7/1957 | Corney . | |
| 2,841,648 | 7/1958 | Thurston . | |
| 3,457,370 | 7/1969 | Boner . | |
| 3,657,480 | 4/1972 | Cheng et al. . | |
| 3,727,004 | 4/1973 | Bose . | |
| 3,816,765 | 6/1974 | Goyer | 307/260 A |
| 3,838,215 | 9/1974 | Haynes, Jr. . | |
| 3,931,469 | 1/1976 | Elliott et al. . | |
| 3,984,635 | 10/1976 | Nestorovic et al. . | |
| 4,015,089 | 3/1977 | Ishii et al. . | |
| 4,031,321 | 6/1977 | Bakgaard . | |
| 4,037,051 | 7/1977 | Fuselier . | |
| 4,074,070 | 2/1978 | Gaus . | |
| 4,081,759 | 3/1978 | Yen . | |
| 4,084,474 | 4/1978 | Leslie . | |
| 4,100,371 | 7/1978 | Bayliff . | |
| 4,128,738 | 12/1978 | Gallery . | |
| 4,133,975 | 1/1979 | Barker, III . | |
| 4,138,594 | 2/1979 | Klipsch . | |
| 4,154,979 | 5/1979 | Barker . | |
| 4,179,669 | 12/1979 | Dobson et al. . | |
| 4,198,540 | 4/1980 | Cizek . | |
| 4,229,618 | 10/1980 | Gamble . | |
| 4,229,619 | 10/1980 | Takahashi et al. . | |
| 4,237,340 | 12/1980 | Klipsch . | |
| 4,238,744 | 12/1980 | Iwahara . | |
| 4,243,840 | 1/1981 | Kates . | |
| 4,249,042 | 2/1981 | Orban . | |
| 4,282,402 | 8/1981 | Liontonia . | |

(List continued on next page.)

FOREIGN PATENT DOCUMENTS

| | | |
|---|---|---|
| 1148091 | 6/1982 | Canada . |
| 0050067 | 9/1981 | European Pat. Off. . |
| 2910318 | 3/1979 | Germany . |
| 3347753 | 7/1983 | Germany . |
| 57-113693 | 7/1982 | Japan . |
| 6271398 | 9/1985 | Japan . |
| 1254608 | 4/1969 | United Kingdom . |
| 2064266 | 3/1980 | United Kingdom . |
| 2095073 | 1/1982 | United Kingdom . |
| 2126455 | 3/1983 | United Kingdom . |
| 2145904 | 8/1983 | United Kingdom . |
| 2163621 | 3/1985 | United Kingdom . |
| 2159017 | 5/1985 | United Kingdom . |

OTHER PUBLICATIONS

Jim Brown—Impedance Matching—May 1985/Sound & Communications—pp. 10, 11, & 15.

J. Wilkinson—Bookshelf Loudspeaker Improvements—Feb. 1982/Wireless World—p. 41.

*Primary Examiner*—Ping Lee
*Attorney, Agent, or Firm*—Hovey, Williams, Timmons & Collins

[57] ABSTRACT

An audio crossover circuit for use with audio speakers is disclosed. The audio crossover circuit includes a pair of inductors that are series connected and inductively coupled and a pair of capacitors. The inductors and capacitors cooperate for achieving a low-pass crossover slope in excess of 30 dB/octave within one half of an octave of the crossover frequency, thereby eliminating the need for additional inductors and capacitors. The crossover circuit also includes a resistor in series with one of the capacitors for further enhancing the crossover slope beyond an octave above the crossover frequency.

6 Claims, 1 Drawing Sheet

U.S. PATENT DOCUMENTS

| | | | |
|---|---|---|---|
| 4,287,389 | 9/1981 | Gamble . | |
| 4,295,006 | 10/1981 | Tanaka et al. . | |
| 4,315,102 | 2/1982 | Eberbach . | |
| 4,340,778 | 7/1982 | Cowans et al. . | |
| 4,348,549 | 9/1982 | Berlant . | |
| 4,348,552 | 9/1982 | Siccone . | |
| 4,349,697 | 9/1982 | Skabla . | |
| 4,383,134 | 5/1983 | Von Recklinghausen . | |
| 4,410,063 | 10/1983 | Yasue et al. . | |
| 4,421,949 | 12/1983 | Eberbach . | |
| 4,426,552 | 1/1984 | Cowans et al. . | |
| 4,429,181 | 1/1984 | Freadman . | |
| 4,430,527 | 2/1984 | Eberbach . | |
| 4,475,233 | 10/1984 | Watkins . | |
| 4,483,015 | 11/1984 | Strohbeen . | |
| 4,578,809 | 3/1986 | Eberbach . | |
| 4,583,245 | 4/1986 | Gelow et al. . | |
| 4,589,135 | 5/1986 | Baker . | |
| 4,593,405 | 6/1986 | Frye et al. . | |
| 4,597,100 | 6/1986 | Grodinsky et al. . | |
| 4,606,071 | 8/1986 | White, Jr. . | |
| 4,638,505 | 1/1987 | Polk et al. . | |
| 4,653,103 | 3/1987 | Mori et al. . | |
| 4,691,362 | 9/1987 | Eberbach . | |
| 4,723,289 | 2/1988 | Schreiber et al. . | |
| 4,769,848 | 9/1988 | Eberbach . | |
| 4,771,466 | 9/1988 | Modafferi . | |
| 4,882,760 | 11/1989 | Yee . | |
| 4,897,879 | 1/1990 | Geluk . | |
| 5,109,423 | 4/1992 | Jacobson et al. . | |
| 5,153,915 | 10/1992 | Farella . | |
| 5,185,801 | 2/1993 | Meyer et al. . | |
| 5,327,505 | 7/1994 | Kim . | |
| 5,359,664 | 10/1994 | Steuben . | |
| 5,373,563 | 12/1994 | Kukurudza . | |
| 5,377,274 | 12/1994 | Meyer et al. . | |
| 5,568,560 | 10/1996 | Combest | 391/98 |

a
a
24 dB/octave
Amplitude
Frequency
b'
b'
12 dB/octave
12dB/Octave
Augmented by
natural rolloff
30+ dB/octave,
fast acting
Amplitude
Frequency To Speaker L1
L2
To Audio
Signal Source 10
R1
C1
C2
L2
26
L1
L3
to audio
signal source
C3
C4
C5
L4
L5
L6
R2
C6
R3
12
10
18
20
14
16
22
24
R1
C2
C1
L2
L1
C5
C4
L5
L4
L3
C3
R3
R2
L6
C6
12

AUDIO CROSSOVER CIRCUIT

BACKGROUND OF THE INVENTION

1. Field of the Invention

The present invention relates to audio crossover circuits for use with audio speakers, and more particularly to an audio crossover circuit including "fast acting" circuitry for achieving a low-pass crossover slope in excess of 30 dB/octave in less than an octave of the crossover frequency using a minimum number of components.

2. Description of the Prior Art

Audio crossover circuits divide audio signals into different frequency bands or ranges for driving two or more speakers in a speaker system. The crossover circuits apportion the frequency spectrum in such a way that each speaker operates in its optimum frequency range and the entire speaker system reproduces sound with a minimum of distortion.

The frequency at which an audio crossover circuit delivers signals to two speakers operating at adjacent frequency ranges is called the crossover frequency. An audio crossover circuit passes a selected frequency range or band of signals to each speaker and attenuates frequencies that are beyond a speaker's crossover frequency. In this way, each speaker reproduces audio signals only in its optimum frequency range and then "rolls off" near the crossover frequency.

The rate at which a crossover circuit attenuates frequencies delivered to a speaker beyond the crossover frequency is called the crossover slope. Crossover slopes are measured in dB of attenuation per octave and are categorized by their magnitude or "steepness".

Audio crossover circuits typically include high-pass and low-pass filter networks having a plurality of capacitors and inductors. The steepness of an audio crossover circuit's crossover slope is primarily determined by the number of capacitors and inductors used. For example, audio crossover circuits having crossover slopes of 6 dB/octave generally have one inductor or capacitor for each filter network. Audio crossover circuits having crossover slopes of 12 dB/octave generally have two inductors or capacitors for each filter network. In general, each additional component adds approximately 6 dB/octave to the crossover slope.

Steep crossover slopes are desirable for several reasons. For example, crossover circuits with steep crossover slopes attenuate frequencies that are beyond a speaker's effective operating range more rapidly so that the speaker audibly reproduces only audio signals in its optimum frequency range, reducing distortion from signals outside the range. In other words, crossover circuits with steep crossover slopes prevent distortion from too much treble energy being delivered to a low frequency range speaker or woofer and prevent distortion from too much bass energy being delivered to higher frequency range speakers such as mid-range speakers or tweeters.

Another reason steep crossover slopes are desirable is because they allow the operating ranges of the speakers to be extended. Since audio crossover circuits with steep crossover slopes attenuate frequencies that are beyond a speaker's effective operating range rapidly, the "roll off" point where audio signals delivered to the speaker are attenuated by the crossover circuit can be moved closer to the range limit, thus allowing an individual speaker to operate over a wider range of frequencies.

A further reason audio crossover circuits with steep crossover slopes are desirable is because they reduce or eliminate interference between speakers operating at adjacent frequency ranges. Since frequencies that are beyond a speaker's effective operating range are attenuated rapidly by these crossover circuits, the speakers reproduce audio signals in their optimum frequency ranges only without reproducing signals in the frequency ranges of adjacent speakers. This reduces interference between adjacent speakers.

Applicant has discovered that it is also advantageous to produce an audio crossover circuit that is "fast-acting". "Fast acting" crossover circuits reach their maximum crossover slopes faster than prior art crossover circuits. Prior art crossover circuits reach their maximum slope in approximately one octave. Applicant has discovered that a crossover circuit that reaches its maximum crossover slope in one half octave improves speaker performance because frequencies outside of the speaker's optimum operating range are attenuated twice as rapidly. Therefore, all the benefits of a steep crossover slope, as discussed above, are doubled.

A "fast acting", steep crossover slope is especially important on the low-pass side of the crossover because a speaker's natural acoustic output typically does not roll off above the usable frequency range, rather it begins to distort. Conversely, on the high-pass side of the crossover, the natural acoustic output typically rolls off immediately below the usable frequency range, providing the opportunity to naturally augment the crossover slope and speed, and make unnecessary a fast-acting, high slope on the high-pass side. Therefore a cost-effective high-performance crossover design can be achieved by a fast-acting, steep slope on the low-pass side of over 30 dB/octave within one half octave, and using a lower slope, such as 12 dB/octave, on the high-pass side. This asymmetrical circuit design uses the natural roll off below the crossover frequency to augment both the speed and slope of the speaker output, thus resulting in an effective high-pass slope of the speaker output that is symmetrical with the low-pass speaker output. In addition, this design increases the useful range of each speaker on the high-pass side because the crossover point can be moved closer to the natural roll off than in prior art symmetrical circuit designs where high-pass and low-pass slopes are the same.

Prior art attempts to produce audio crossover circuits with steep crossover slopes have been limited by competing interests of cost and performance. To produce economical speaker systems, most audio crossover circuits only utilize a few inductors and capacitors that achieve crossover slopes of 24 dB/octave or less, and because of size limitations, the typical crossover slope is 12 dB/octave or less. Additionally, these prior art audio crossover circuits have not addressed the objective of reaching the maximum crossover slope rapidly, and thus don't reach their maximum slope until more than a full octave. As discussed above, such slow-acting crossover circuits with low crossover slopes result in poor speaker performance since frequencies outside of the speaker's optimum operating range are attenuated too slowly and speakers operating at adjacent frequency ranges interfere with one another.

On the other hand, prior art attempts to produce audio crossover circuits with crossover slopes in excess of 24 dB/octave have been impractical due to high costs and excessive weight. To achieve crossover slopes in excess of 24 dB/octave, the accepted practice is to use a combination of five or more inductors and capacitors per filter. These additional electrical components increase the cost and weight of the crossover circuits and thus limit their utility. Moreover, these prior art audio crossover circuits have not addressed the objective of reaching the maximum crossover slopes rapidly, and thus don't reach their maximum slope until approximately a full octave.

Another limitation of prior art audio crossover circuits is their size. Small speakers are desired to meet tight space requirements of many of today's audio systems. However, speaker manufacturers' attempts to build smaller and lighter speakers have been somewhat limited by the relatively large size of prior art audio crossover circuits. Prior art audio crossover circuits are large because of the number of components and because the inductors are spaced to reduce electrical and magnetic interference therebetween. The spacing of components fails to take advantage of mutual coupling of inductors and results in a larger crossover circuit.

U.S. Pat. No. 5,568,560, which was invented by the present applicant and which is owned by the assignee of the present application, discloses an audio crossover circuit that overcomes many of the limitations described above. Specifically, the audio crossover circuit disclosed in the '560 patent achieves a low pass crossover slope in excess of 24 dB/octave using only four electrical components, reaches its maximum crossover slope in less than an octave of the crossover frequency, and is relatively small and compact.

Although the crossover circuit disclosed in the '560 patent works well with normal audio components, Applicant has discovered that it exhibits undesirable characteristics when it is constructed with high performance audio components having lower resistance values. Higher performance components improve the power utilization of the crossover circuit by reducing the amount of power lost in the crossover; however, they also cause an undesirable "rebound effect" in the crossover slope beyond the first octave above the crossover frequency.

Accordingly, there is a need for an improved audio crossover circuit that can be made with higher performance, low resistance components without suffering from the crossover slope "rebound effect" exhibited by prior art crossover circuits.

OBJECTS AND SUMMARY OF THE INVENTION

The present invention overcomes the problems outlined above and provides a distinct advance in the state of the art. More particularly, the present invention provides a fast acting audio crossover circuit that 1) achieves a low pass crossover slope in access of 30 dB/octave within ½ octave of its crossover frequency, 2) uses a minimum number of electrical components, 3) fits on a standard 12 dB/octave circuit board, and 4) exhibits a reduced "rebound effect" in high performance component applications.

The preferred audio crossover circuit includes a low-pass filter network operable for passing a selected range of audio signals from an audio signal source to a speaker and for attenuating other frequencies at a rate in excess of 30 dB/octave. Those skilled in the art will appreciate that a plurality of filter networks may be provided for driving a plurality of speakers.

The low-pass filter network includes a pair of inductors and a pair of capacitors. The inductors are electrically coupled in series between the audio signal source and the speaker and are inductively coupled together. The inductors are also electrically connected so that the windings of their coils are reversed with respect to one another so that at any given time current is flowing in opposite directions in the inductor coils.

The first capacitor is electrically coupled in parallel between the junction of the inductors, and the second capacitor is coupled in parallel between the inductors and the speaker.

The inductors and the capacitors cooperate for passing a selected range or band of frequencies of the audio signals to the speaker and for attenuating other frequencies at a rate in excess of 30 dB/octave. Moreover, the preferred audio crossover circuit reaches its maximum crossover slope within the first half octave of the roll-off point.

In accordance with the present invention, the low pass filter network also includes a resistor that is coupled in series with the second capacitor. The resistor reduces the "rebound effect" of the low pass filter and therefore improves the roll off characteristics of the crossover circuit beyond the first octave above the crossover frequency of the circuit without comprising crossover performance in other respects.

By providing a crossover circuit constructed as described above, numerous advantages are realized. For example, by providing a fast-acting audio crossover circuit having a low-pass crossover slope in excess of 30 dB/octave, unwanted frequencies are attenuated more than twice as rapidly as prior art crossovers. Therefore, interference between speakers operating at adjacent frequency ranges is reduced or eliminated. Additionally, the effective operating range of each speaker can be extended, while containing frequencies within the range and reducing distortion.

A more particular advantage of the preferred audio crossover circuit is that it achieves a low-pass crossover slope in excess of 30 dB/octave faster than prior art crossover circuits with only 2 inductors and 2 capacitors. Applicant has discovered that by electrically connecting the inductors in series and inductively coupling the inductors together, low-pass crossover slopes in excess of 30 dB/octave are achieved within the first half octave without the use of additional electrical components.

Additionally, by providing the resistor in series with the second capacitor of the low pass filter network, the "rebound effect" of the crossover circuit is reduced.

In accordance with the present invention, the low pass filter network also includes a resistor that is coupled in series with the second capacitor. The resistor reduces the "rebound effect" of the low pass filter and therefore improves the roll off characteristics of the crossover circuit beyond the first octave above the crossover frequency of the circuit.

Finally, by taking advantage of natural coupling of inductors, the present audio crossover circuit fits on a standard 12 dB/octave circuit board, thus reducing the cost, weight and space requirements of the crossover circuit and thereby increasing its utility.

BRIEF DESCRIPTION OF THE DRAWING FIGURES

A preferred embodiment of the present invention is described in detail below with reference to the attached drawing figures, wherein.

DETAILED DESCRIPTION OF THE PREFERRED EMBODIMENTS

Figures 1, 2, 3, 4, 5:
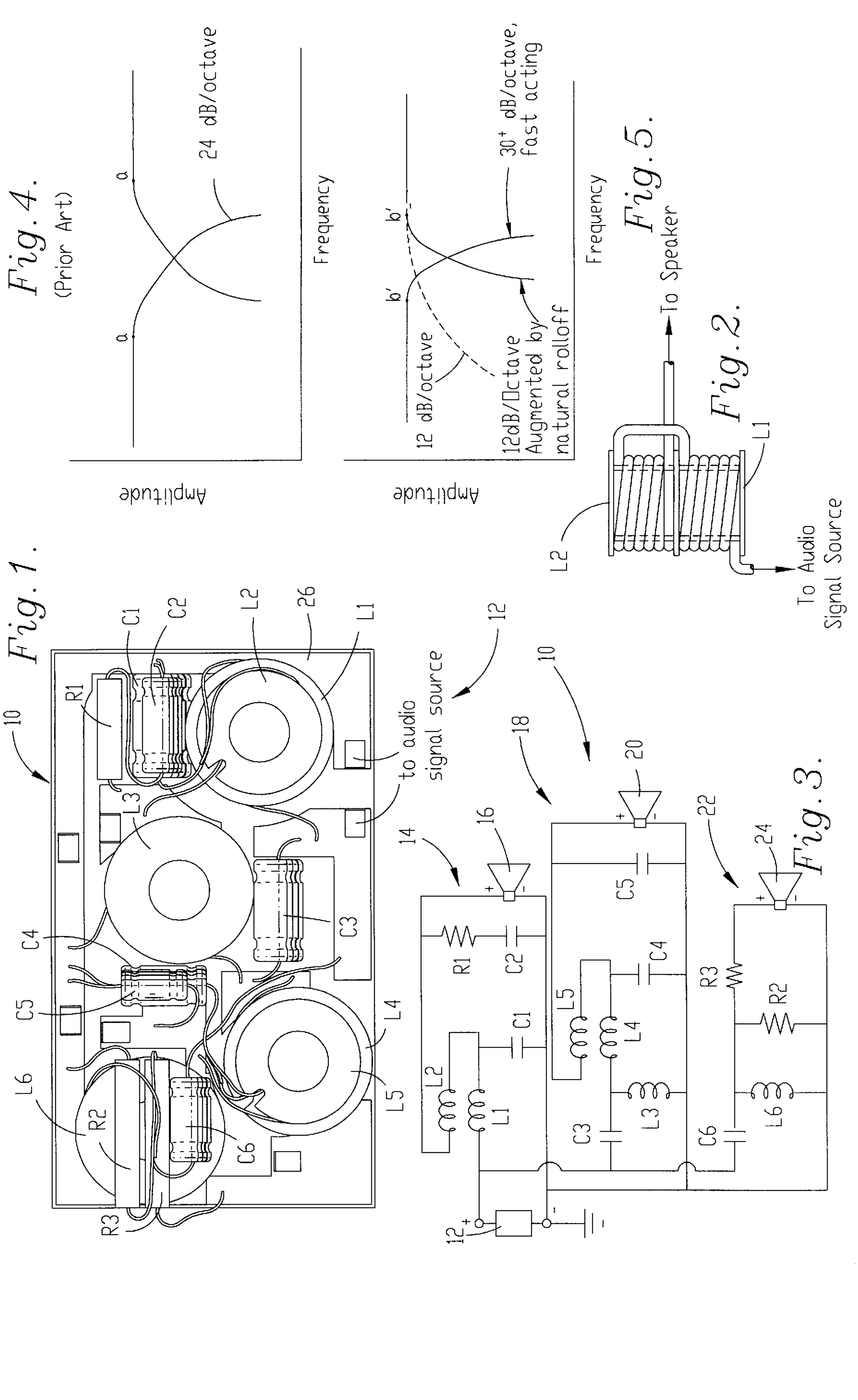
Fig. 4. (Prior Art)
FIG. 1 is a top view of an audio crossover circuit constructed in accordance with a preferred embodiment of the invention.
FIG. 2 is a detail view of a portion of one filter network of the audio crossover circuit illustrating the placement and winding of the inductors.
FIG. 3 is an electrical schematic diagram of the audio crossover circuit illustrated in FIG. 1.
FIG. 4 is a graph illustrating the amplitude vs. frequency response of prior art audio crossover circuits.
FIG. 5 is a graph illustrating the amplitude vs. frequency response of the audio crossover circuit of the present invention.

FIG. 1 illustrates audio crossover circuit 10 constructed in accordance with the preferred embodiment of the invention. FIG. 3 illustrates audio crossover circuit 10 in electrical schematic form. Preferred audio crossover circuit 10 receives audio signals from audio signal source 12 for driving a plurality of speakers.

Preferred audio crossover circuit 10 broadly includes first filter network 14 for driving speaker 16, second filter network 18 for driving speaker 20, and third filter network 22 for driving speaker 24. Each filter network is operable for passing a selected range or band of audio signals from audio signal source 12 to its respective speaker and for attenuating other frequencies. Those skilled in the art will appreciate that additional filter networks may be provided for driving additional speakers. As illustrated in FIG. 1, the individual components of filter networks 14, 18 and 22 are preferably mounted to a single housing such as a conventional circuit board 26.

In more detail, audio signal source 12 generates audio signals for delivery to the input terminals of crossover circuit 10 and may include a conventional stereo receiver, amplifier or other audio component. Speakers 16, 20 and 24 receive selected frequency ranges or bands of the audio signals from their respective filter networks and convert the audio signals to acoustic energy.

Speaker 16 is preferably a low frequency "woofer" type speaker that reproduces low-frequency audio signals such as a Model No. 832757, 4-ohm, 6.5" speaker manufactured by Peerless. Speaker 20 is preferably a "mid-range" type speaker that reproduces mid-frequency audio signals such as a Model No. 821385, 8-ohm, 4.5" speaker manufactured by Peerless. Speaker 24 is preferably a "tweeter" type speaker that reproduces high frequency audio signals such as a Model No. T90K, 8-ohm, 30 mm speaker manufactured by Focal.

Those skilled in the art will appreciate that the selection of audio signal source 12 and speakers 16, 20 and 24 is a matter of design choice. Other audio components may be substituted without varying from the scope of the present invention.

First filter network 14 is operable for passing low-frequency range audio signals from audio signal source 12 to speaker 16 and for attenuating other frequencies. First filter network 14 includes inductors L1 and L2 and capacitors C1 and C2.

Inductors L1 and L2 are electrically coupled in series between audio signal source 12 and speaker 16. As illustrated in FIGS. 1 and 2, inductors L1 and L2 are inductively coupled together by stacking one inductor on top of the other and are electrically connected so that current is flowing in their coils in opposite directions at any given time (see FIG. 2). Alternatively, the two inductors may be wound together rather than stacked. Inductors L1 and L2 are preferably low D.C. resistive coils having values of 2.0 mH, 0.2 ohms and 1.0 mH, 0.1 ohms, respectively.

As described in more detail below, it has been discovered that by electrically connecting inductors L1 and L2 in series, inductively coupling the inductors together, and reversing the flow of current in the coils of the inductors, low-pass crossover slopes in excess of 30 dB/octave are achieved within the first half octave without the use of additional components. This reduces the cost, weight and space requirements of crossover circuit 10 and thereby increases its utility.

Capacitor C1 is electrically coupled in parallel between the junction of inductors L1 and L2. Capacitor C2 is coupled in parallel between inductor L2 and speaker 16. Capacitors C1 and C2 preferably have values of approximately 80 uF and 33 uF, respectively.

Inductors L1 and L2 and capacitors C1 and C2 cooperate for passing low frequency range frequencies of the audio signals to speaker 16 and for attenuating other frequencies at a rate in excess of 30 dB/octave within one half octave. Filter network 14 as described above has a low-pass crossover frequency of approximately 350 Hz. Those skilled in the art will appreciate that the crossover frequency can be varied by selecting different values for L1, L2, C1, and C2 using standard 24 dB/octave solutions as approximations.

In accordance with the present invention, the low pass filter network also includes resistor R1, preferably having a value of 4 ohms, that is coupled in series with capacitor C2. Resistor R1 reduces the "rebound effect" of the low pass filter by approximately 40% and therefore significantly improves the roll off characteristics of the crossover circuit beyond the first octave above the crossover frequency of the circuit.

Second filter network 18 is operable for passing mid-frequency range audio signals from audio signal source 12 to speaker 20 and for attenuating both low range frequencies and high range frequencies. Second filter network 18 includes a high-pass filter made up by inductor L3 and capacitor C3, and a low-pass filter made up by inductors L4 and L5 and capacitors C4 and C5.

To make up the high-pass filter portion of second filter network 18, inductor L3 is electrically coupled in parallel with audio source 12 and preferably has a value of approximately 1.5 mH. Capacitor C3 is electrically coupled in series with audio source 12 and preferably has a value of about 80 mF. Inductor L3 and capacitor C3 cooperate for passing mid-range and above frequencies of the audio signals to speaker 20 and for attenuating other frequencies. The preferred second filter network 18 has a high-pass crossover frequency equal to the low-pass crossover frequency of first filter network 14, which is approximately 350 Hz.

To make up the low-pass filter portion of second filter network 18, inductors L4 and L5 are electrically coupled in series between audio signal source 12 and speaker 20. As illustrated in FIG. 1, inductors L4 and L5 are inductively coupled together by stacking one inductor on the top of the other and are electrically connected so that current is flowing in their coils in opposite directions at any given time. Inductors L4 and L5 preferably have values of approximately 0.72 mH and 0.32 mH, respectively.

Capacitor C4 is electrically coupled in parallel between the junction of inductors L4 and L5. Capacitor C5 is coupled in parallel between inductor L5 and speaker 20. Capacitors C4 and C5 preferably have values of approximately 12 uF and 4 uF, respectively. Inductors L4 and L5 and capacitors C4 and C5 cooperate for passing midrange and below frequencies of the audio signals to speaker 20 and for attenuating high range frequencies. The preferred second filter network has a low-pass crossover frequency of approximately 2100 Hz.

Third filter network 22 is operable for passing high frequency range audio signals from audio signal source 12 to speaker 24 and for attenuating both low and mid-range frequency audio signals. Third filter network includes inductor L6, capacitor C6 and resistors R1 and R2.

Inductor L6 is electrically coupled in parallel with audio signal source 12 and preferably has a value of approximately 0.5 mH. Capacitor C6 is electrically coupled in series with audio signal source 12 and preferably has a value of approximately 9 mF. Inductor L3 and capacitor C3 cooperate for passing high range frequencies of the audio signals to speaker 24 and for attenuating other frequencies. Resistors R2 and R3 are provided for reducing the overall output level of the high-frequency speaker 24. Resistors R2 and R3 preferably have values of approximately 10 ohm and 30 ohm, respectively. The preferred third filter network 22 has a high-pass crossover frequency of approximately 2100 Hz.

In operation, filter networks 14, 18, and 22 of audio crossover circuit 10 divide audio signals delivered by audio signal source 12 into different frequency bands for driving speakers 16, 20, and 24, respectively. Crossover circuit 10 divides the frequency spectrum among speakers 16, 20, and 24 so that each speaker operates in its optimum frequency range and the speakers together reproduce sound with a minimum of distortion.

The low-pass filter components of audio circuit 10, namely inductors L1 and L2 and capacitors C1 and C2 of first filter network 14, and inductors L4 and L5 and capacitors C4 and C5 of second filter network 18, cooperate for passing selected low frequency bands or ranges of the audio signals to their respective speakers and for attenuating other frequencies at a rate in excess of 30 dB/octave. It has been discovered that by electrically connecting two inductors in series, inductively coupling the inductors together, and reversing the flow of current in the inductors, low-pass crossover slopes in excess of 30 dB/octave within the first half octave are achieved without the use of additional components. This reduces the cost, weight and space requirement of crossover circuit 10 and thereby increases its utility.

First and second filter networks 14 and 18 achieve low-pass crossover slopes in excess of 30 dB/octave within the first half octave because of the cooperation between the series connected and inductively coupled inductors. Below the filter networks' crossover frequencies, the inductors do not significantly cancel or augment each other even though the directions of their windings are reversed. However, above the crossover frequencies, the phase of the signals within the inductors begins to shift, resulting in a cancellation effect because of the reversal of their windings. The cancellation effect increases the low-pass crossover slopes of first and second filter networks 14 and 18 and the speed at which the crossover slopes reach their maximum crossover slope. Applicant has discovered that if the inductors are not connected in series, inductively coupled, and coupled so that their windings are reversed, no cancellation occurs, thus reducing the crossover slope and the speed of the crossover circuit.

The use of less components and the stacking of the inductors also saves space on circuit board 26. The preferred crossover circuit 10 requires a platform measuring only 4" by 7". This allows the entire crossover circuit 10 to fit on a standard 12 dB/octave circuit board.

FIGS. 4 and 5 illustrate the advantages of achieving a steep crossover slope rapidly. FIG. 4 illustrates a prior art crossover circuit having a low-pass crossover slope of 24 dB/octave. The points labeled "a" are the rolloff frequencies of two speakers operating at adjacent frequency slopes. FIG. 5 illustrates the crossover circuit of the present invention, which achieves a low-pass crossover slope of greater than 30 dB/octave within the first half octave. The points labeled "b" are the rolloff points of the same speakers in FIG. 4. On the high-pass side of the crossover, the natural acoustic output typically rolls off immediately below the usable frequency range, providing the opportunity to naturally augment the crossover slope and speed, and make unnecessary a fast-acting, high slope on the high-pass side. Therefore a cost-effective, high-performance crossover design can be achieved by increasing the slope on the low-pass side to over 30 dB/octave within one half octave, and using a lower slope, such as 12 dB/octave, on the high-pass side.

Although the invention has been described with reference to the preferred embodiment illustrated in the attached drawing figures, it is noted that equivalents may be employed and substitutions made herein without departing from the scope of the invention as recited in the claims. For example, four filter networks and three corresponding speakers are illustrated and described for purposes of disclosing a preferred embodiment of the invention. However, as those skilled in the art will appreciate, more or less filter networks and speakers may be provided. Additionally, the low-pass filter portions of the first and second filter network are illustrated and described as including only four electrical components. However, if crossover slopes of greater magnitude are desired, additional electrical components can be added to the filter networks in a conventional manner.

Having thus described the preferred embodiment of the invention, what is claimed as new and desired to be protected by Letters Patent includes the following:

1. An audio crossover circuit for use with a loudspeaker comprising:

means for coupling with a source of audio signals;

means for coupling with a speaker;

a first inductor connected between said source coupling means and said speaker coupling means;

a second inductor electrically coupled in series with said first inductor between said source coupling means and said speaker coupling means, said first and second inductors being electrically coupled so that current flowing in said first inductor is in the opposite direction as current flowing in said second inductor, said first and second inductors being stacked and presenting a junction therebetween;

a first capacitor electrically coupled with said junction;

said first and second inductors and said first capacitor cooperatively making up means for passing a selected range of frequencies of the audio signals to the speaker and for attenuating other frequencies;

said first capacitor being coupled in parallel between said first and second inductors at said junction;

a second capacitor coupled in parallel between said second inductor and said speaker coupling means; and a resistor coupled in series with said second capacitor.

2. The crossover circuit as set forth in claim 1, said first and second inductors and said first and second capacitors cooperatively making up low pass filter means for passing a selected range of frequencies of the audio signals to the speaker, for attenuating other frequencies at a rate of 30 dB/octave or greater, and for reaching an attenuation rate of 30 dB/octave in less than ½ of an octave.

3. The crossover circuit as set forth in claim 2, further including a circuit board for mounting said inductors and said capacitors.

4. The crossover circuit as set forth in claim 1, wherein said first and second inductors are both wound on a single core.

5. An audio crossover circuit for use with a loudspeaker, said audio crossover circuit comprising:

means for coupling with a source of audio signals;

means for coupling with a speaker; and low pass filter means for passing a selected range of frequencies of the audio signals to the speaker, for attenuating other frequencies at a rate of 30 dB/octave or greater, and for reaching an attenuation rate of 30 dB/octave in less than ½ of an octave, said low pass filter means consisting of a first inductor connected between said source coupling means and said speaker coupling means, a second inductor electrically coupled in series with said first inductor between said source coupling means and said speaker coupling means, said first and second inductors being electrically coupled so that current flowing in said first inductor is in the opposite direction as current flowing in said second inductor, said first and second inductors being stacked and presenting a junction therebetween, a first capacitor electrically coupled with said junction, a second capacitor coupled in parallel between said first and second inductors and said speaker coupling means, and a resistor coupled in series with said second capacitor.

6. The crossover circuit as set forth in claim 5, wherein said first and second inductors are wound together.

* * * * *